(12) United States Patent
Weng et al.

(10) Patent No.: US 11,079,681 B2
(45) Date of Patent: Aug. 3, 2021

(54) LITHOGRAPHY METHOD FOR POSITIVE TONE DEVELOPMENT

(71) Applicant: TAIWAN SEMICONDUCTOR MANUFACTURING CO., LTD., Hsinchu (TW)

(72) Inventors: Ming-Hui Weng, New Taipei (TW); Chen-Yu Liu, Kaohsiung (TW); Cheng-Han Wu, Taichung (TW); Ching-Yu Chang, Yilan County (TW); Chin-Hsiang Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 175 days.

(21) Appl. No.: 16/248,601

(22) Filed: Jan. 15, 2019

(65) Prior Publication Data

US 2020/0159110 A1 May 21, 2020

Related U.S. Application Data

(60) Provisional application No. 62/770,677, filed on Nov. 21, 2018.

(51) Int. Cl.
| | | |
|---|---|---|
| *G03F 7/40* | (2006.01) | |
| *G03F 7/30* | (2006.01) | |
| *G03F 7/32* | (2006.01) | |
| *G03F 7/20* | (2006.01) | |
| *G03F 1/82* | (2012.01) | |

(52) U.S. Cl.
CPC .................. *G03F 7/40* (2013.01); *G03F 1/82* (2013.01); *G03F 7/30* (2013.01); *G03F 7/322* (2013.01); *G03F 7/70925* (2013.01)

(58) Field of Classification Search
CPC ........................................................ G03F 7/40
See application file for complete search history.

(56) References Cited

U.S. PATENT DOCUMENTS

| | | | |
|---|---|---|---|
| 8,796,666 | B1 | 8/2014 | Huang et al. |
| 9,012,132 | B2 | 4/2015 | Chang |
| 9,093,530 | B2 | 4/2015 | Huang et al. |
| 9,028,915 | B2 | 5/2015 | Chang et al. |
| 9,146,469 | B2 | 9/2015 | Liu et al. |
| 9,213,234 | B2 | 12/2015 | Chang |
| 9,223,220 | B2 | 12/2015 | Chang |
| 9,256,133 | B2 | 2/2016 | Chang |
| 9,536,759 | B2 | 1/2017 | Yang et al. |
| 9,548,303 | B2 | 1/2017 | Lee et al. |
| 2002/0086242 | A1* | 7/2002 | Boehm ................. G03F 7/3021 430/311 |
| 2011/0104900 | A1* | 5/2011 | Hinsberg .......... H01L 21/28123 438/694 |
| 2016/0103395 | A1 | 4/2016 | Tsubaki et al. |

FOREIGN PATENT DOCUMENTS

| | | |
|---|---|---|
| CN | 1696834 A | 11/2005 |
| EP | 3193359 A1 | 7/2017 |
| JP | 3703094 B2 | 10/2005 |
| TW | 200632593 A | 9/2006 |
| WO | 2004/059700 A2 | 7/2004 |
| WO | 2016/076032 A1 | 5/2016 |

* cited by examiner

*Primary Examiner* — Kathleen Duda
(74) *Attorney, Agent, or Firm* — Maschoff Brennan

(57) ABSTRACT

A lithography method includes forming a resist layer over a substrate. The resist layer is exposed to radiation. The exposed resist layer is developed using a developer that removes an exposed portion of the exposed resist layer, thereby forming a patterned resist layer. The patterned resist layer is rinsed using a basic aqueous rinse solution.

20 Claims, 11 Drawing Sheets

200

200

200

200

LITHOGRAPHY METHOD FOR POSITIVE TONE DEVELOPMENT

PRIORITY CLAIM AND CROSS-REFERENCE

This application claims priority to U.S. Provisional Application Ser. No. 62/770,677, filed Nov. 21, 2018, which is herein incorporated by reference.

BACKGROUND

Lithography is extensively utilized in integrated circuit (IC) manufacturing, where various IC patterns are transferred to a workpiece to form an IC device. A lithography process may involve forming a resist layer over the workpiece, exposing the resist layer to patterned radiation, and developing the exposed resist layer, thereby forming a patterned resist layer. As IC technologies continually progress towards smaller technology nodes, the structural integrity of resist patterns becomes more vulnerable, as resist patterns are more prone to deformation, collapse, and/or peeling. Multiple factors affect these parameters, among which are the choice of developers and rinse solutions used on an exposed resist layer. Positive tone development (PTD) which removes exposed portions of the resist layer and negative tone development (NTD) which removes unexposed portions of the resist layer often use different developers and rinse solutions. Current PTD and NTD processes lead to various resist structural issues. Accordingly, although existing lithography techniques have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
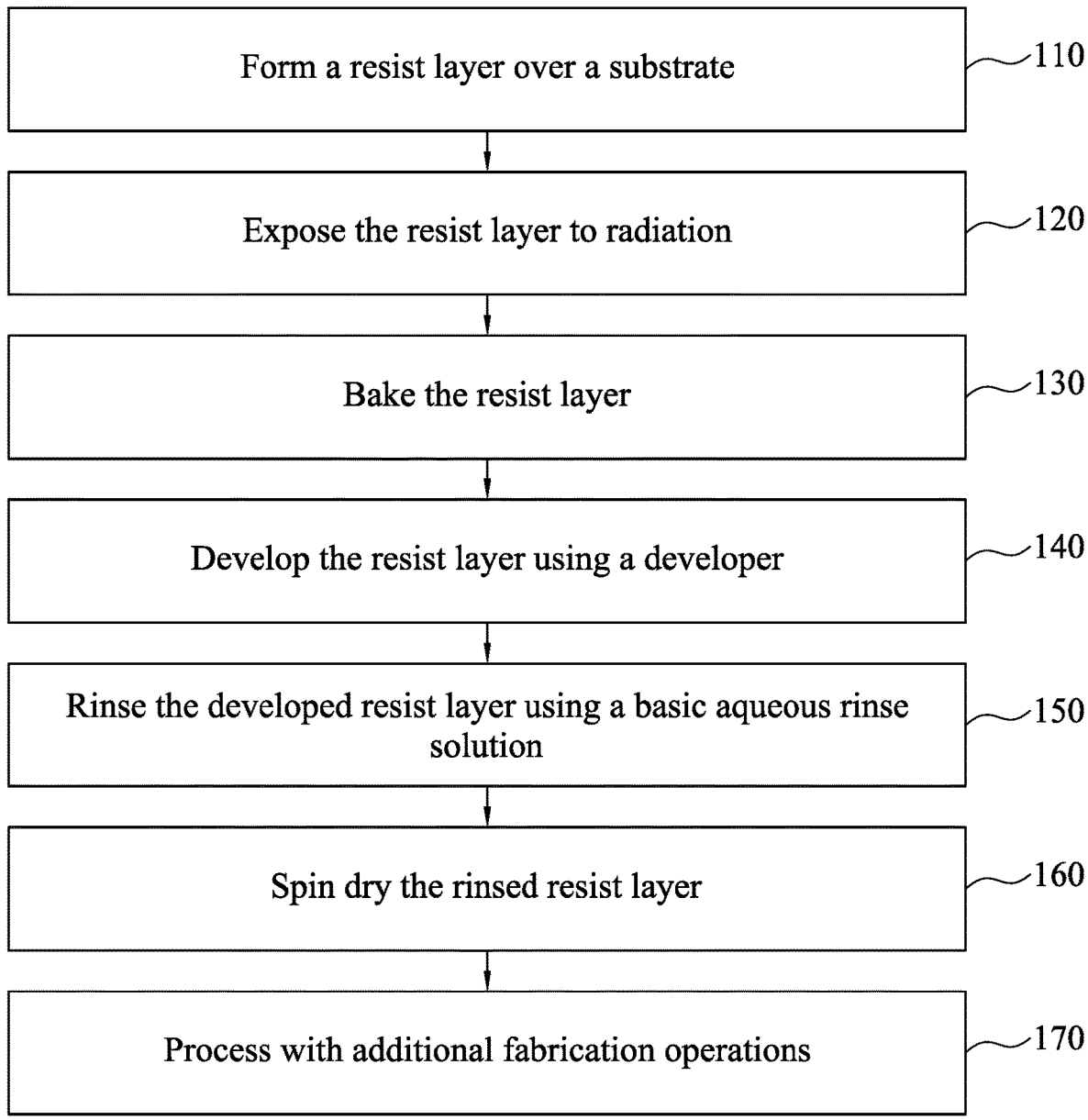
FIG. 1 is a flow chart of a lithography method for processing a workpiece according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

Lithography may use one of two types of developing processes: a positive tone development (PTD) process and a negative tone development (NTD) process. The PTD process uses a positive tone developer, which refers to a developer that selectively dissolves and removes exposed portions of the resist layer. The NTD process uses a negative tone developer, which refers to a developer that selectively dissolves and removes unexposed portions of the resist layer. The PTD process uses aqueous-based developers and aqueous-based rinse solutions. The NTD process uses organic-based developers and organic-based rinse solutions. Both PTD processes and NTD processes have drawbacks when attempting to meet lithography resolution demands for advanced technology nodes. For example, both PTD processes and NTD processes have been observed to cause resist pattern swelling, leading to insufficient contrast between exposed portions and unexposed portions of the resist layer (in other words, poor resist contrast) and resulting in deformation, collapse, and/or peeling problems. In PTD, aqueous-based rinse solutions are prone to protonize the carboxyl group of the resist, thereby producing residues of the resist layer.

The present disclosure thus explores PTD-related materials and techniques that can improve the residue problem of the resist layer. For example, the present disclosure solves issues in PTD approaches by changing the composition of rinse solutions. In some embodiments, instead of using purely water in a rinse solution, base is added to the rinse solution to significantly increase its deprotonating ability, which in turn reduces residues in the resist layer. Hydrogen may be removed from the polymer molecules, such that the polymer molecules increase its solubility to the aqueous-based rinse solutions.

FIG. 1 is a flow chart of a lithography method 100 for processing a workpiece (e.g., a substrate) according to various aspects of the present disclosure. In some implementations, method 100 is implemented, in whole or in part, by a system employing advanced lithography processes, such as deep ultraviolet (DUV) lithography, extreme ultraviolet (EUV) lithography, e-beam lithography, x-ray lithography, and/or other lithography to enhance lithography resolution.

The operations of FIG. 1 are first introduced briefly and then elaborated in connection with FIGS. 2A to 2I. At block 110, a resist layer is formed over a substrate. In some implementations, the resist layer is a positive tone resist. At block 120, the resist layer is exposed to radiation in the form of electromagnetic waves. In some implementations, the resist layer is exposed to patterned EUV radiation. At block 130, the exposed resist layer is baked at an elevated temperature using a post-exposure baking (PEB) process. At block 140, the baked resist layer is developed using a developer, which is an aqueous-based solution. The developer dissolves or otherwise removes exposed portions of the resist layer. At block 150, the developed resist layer is rinsed using a basic aqueous rinse solution. At block 160, the rinsed resist layer is spin-dried.

Note that additional operations can be provided before, during, and after method 100, and some of the operations described can be moved, replaced, or eliminated for additional embodiments of the method 100. For example, at block 170, method 100 can proceed with additional fabrication operations on the workpiece. In an embodiment, the block 170 includes a fabrication process using the patterned resist layer as a mask to pattern the material layer on the workpiece. Specifically, the material layer is etched, such that the material layer includes a pattern corresponding with a pattern of the patterned resist layer. In some implementations, doped regions are formed in the material layer, such that the material layer includes a doped pattern corresponding with a pattern of the patterned resist layer.

FIGS. 2A to 2I are cross-sectional views of a workpiece 200, in portion or entirety, at various fabrication stages (such as those associated with method 100) according to various aspects of the present disclosure. The workpiece 200 is depicted at an intermediate stage of fabrication (or processing) of an IC device, such as a microprocessor, a memory, and/or other IC device. In some implementations, the workpiece 200 may be a portion of an IC chip, a system on chip (SoC), or portion thereof, that includes various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LD-MOS) transistors, high voltage transistors, high frequency transistors, fin-like field effect transistors (FinFETs), other suitable IC components, or combinations thereof. FIGS. 2A-2I have been simplified for the sake of clarity. Additional features can be added in the workpiece 200, and some of the features described below can be replaced, modified, or eliminated in other embodiments of the workpiece 200.

Figure 2A:
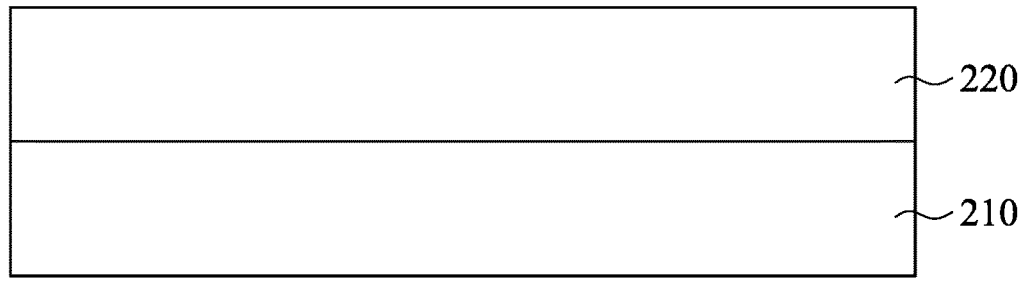
FIGS. 2A to 2I are cross-sectional views of a workpiece, in portion or entirety, at various fabrication stages according to various aspects of the present disclosure.

In FIG. 2A, the workpiece 200 includes a substrate 210. The substrate 210 may include a semiconductor substrate (e.g., a wafer), a mask (also called a photomask or reticle), or any base material on which processing may be conducted to provide layers of material to form various features of an IC device. Depending on an IC fabrication stage, the substrate 210 includes various material layers (e.g., dielectric layers, semiconductor layers, and/or conductive layers) configured to form IC features (e.g., doped regions/features, isolation features, gate features, source/drain features (including epitaxial source/drain features), interconnect features, other features, or combinations thereof). In the depicted embodiment, the substrate 210 includes a semiconductor substrate, such as a silicon substrate. The substrate 210 may include another elementary semiconductor, such as germanium; a compound semiconductor, such as silicon carbide, gallium arsenide, gallium phosphide, indium phosphide, indium arsenide, and/or indium antimonide; an alloy semiconductor, such as SiGe, GaAsP, AlInAs, AlGaAs, GaInAs, GaInP, and/or GaInAsP; or combinations thereof.

Alternatively, the substrate 210 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. In some implementations, where the workpiece 200 is fabricated into a mask for patterning IC devices, the substrate 210 can be a mask substrate that includes a transparent material (e.g., calcium fluoride ($CaF_2$)) or a low thermal expansion material (e.g., fused quartz, $TiO_2$ doped $SiO_2$, or other suitable low thermal expansion materials).

A material layer 220 to be processed (also referred to herein as an underlying layer) is disposed over the substrate 210. However, the present disclosure contemplates implementations where the material layer 220 is omitted, such that the substrate 210 is directly processed. In some implementations, the material layer 220 includes a conductive material or a semiconductor material, such as metal or metal alloy. In some implementations, the metal includes titanium (Ti), aluminum (Al), tungsten (W), tantalum (Ta), copper (Cu), cobalt (Co), ruthenium (Ru), other suitable metal, or combinations thereof. In some implementations, the metal alloy includes metal nitride, metal sulfide, metal selenide, metal oxide, metal silicide, other suitable metal alloy, or combinations thereof. For example, in some implementations, the material layer 220 includes titanium nitride (TiN), tungsten nitride ($WN_2$), or tantalum nitride (TaN).

Alternatively, the material layer 220 includes a dielectric material, such as silicon oxide ($SiO_2$), silicon nitride (SiN), metal oxide, or metal nitride. For example, the material layer 220 may include $SiO_2$, SiN, silicon oxynitride (SiON), silicon carbon nitride (SiCN), silicon carbide (SiC), aluminum oxide ($Al_2O_3$), hafnium oxide ($HfO_2$), or lanthanum oxide ($La_2O_3$). In some implementations, the material layer 220 is a hard mask layer to be patterned for use in subsequent processing of the workpiece 200. In some implementations, the material layer 220 is an anti-reflective coating (ARC) layer. In some implementations, the material layer 220 is a layer to be used for forming a gate feature (e.g., a gate dielectric and/or a gate electrode), a source/drain feature (e.g., an epitaxial source/drain), and/or a contact feature (e.g., a conductive or dielectric feature of a multilayer interconnect (MLI)) of the workpiece 200. In some implementations, where the workpiece 200 is fabricated into a mask for patterning IC devices, the material layer 220 is a layer to be processed to form an IC pattern therein, such as an absorber layer (including, for example, chromium) or a reflective layer (including, for example, multiple layers formed on the substrate 210, where the multiple layers include a plurality of film pairs, such as molybdenum-silicide (Mo/Si) film pairs, molybdenum-beryllium (Mo/Be) film pairs, or other suitable material film pairs configured for reflecting radiation).

Figure 2B:
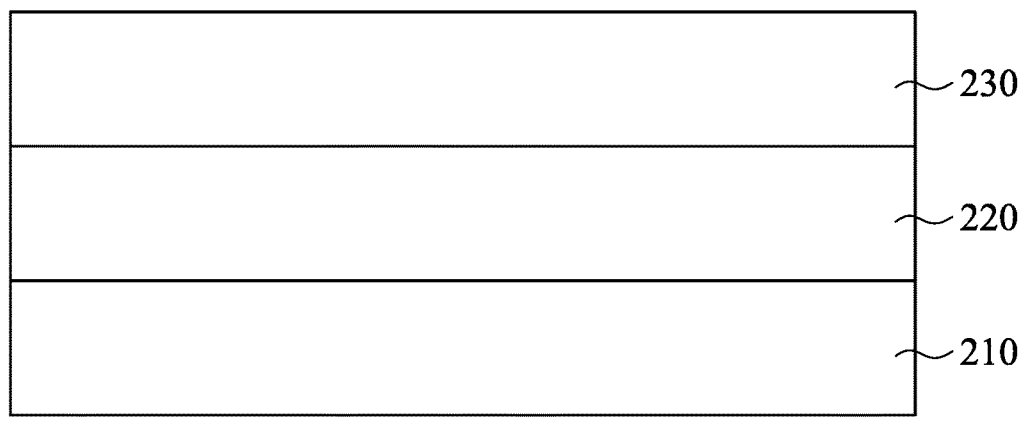

In FIG. 2B, a resist layer 230 is formed on the material layer 220 (or the substrate 210) by a suitable process (e.g., the block 110 of the method 100). The resist layer 230 is also called a photoresist layer, photosensitive layer, imaging layer, patterning layer, or radiation sensitive layer. The resist layer 230 is sensitive to radiation used during a lithography exposure process, such as DUV radiation, EUV radiation, e-beam radiation, ion beam radiation, and/or other suitable radiation. In the depicted embodiment, the resist layer 230 includes a material sensitive to EUV radiation. In some implementations, the resist layer 230 is formed by spin coating a liquid resist material onto a material layer to be processed, such as the material layer 220. After spin coating the liquid resist material (but before performing an exposure process), a pre-bake process can be performed on the resist layer 230, for example, to evaporate solvent and to densify the liquid resist material formed over the material layer 220.

In some embodiments, the resist layer 230 includes a positive tone material (sometimes called a positive tone resist), where portions of the resist layer 230 exposed to radiation becomes soluble (or exhibit increased solubility) to a developer, and unexposed portions of the resist layer 230 remain insoluble to the developer.

In some embodiments, the resist layer 230 is a photosensitive layer that is patterned by exposure to actinic radiation, such as an electron beam (e-beam) in some embodiments. The chemical properties of the resist regions struck by incident radiation change in a manner that depends on the type of photoresist used. The resist layer 230 is a positive resist. The positive resist refers to a resist material that when exposed to radiation becomes soluble in a developer, while the region of the resist that is non-exposed (or exposed less) is insoluble in the developer. Whether a resist is a positive or negative resist may depend on the type of developer used to develop the resist. For example, some positive resists provide a positive pattern, (i.e. —the exposed regions are removed by the developer), when the developer is an aqueous-based developer, such as a tetramethylammonium hydroxide (TMAH) solution.

Resists according to the present disclosure include a polymer resin along with one or more photoactive compounds (PACs) in a solvent, in some embodiments. In some embodiments, the polymer resin includes a hydrocarbon structure (such as an alicyclic hydrocarbon structure) that contains one or more groups that will decompose (e.g., acid labile groups) or otherwise react when mixed with acids, bases, or free radicals generated by the PACs (as further described below). In some embodiments, the hydrocarbon structure includes a repeating unit that forms a skeletal backbone of the polymer resin. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like.

Additionally, some embodiments of the resist include one or more photoactive compounds (PACs). The PACs are photoactive components, such as photoacid generators, photobase generators, free-radical generators, or the like. The PACs may be positive-acting or negative-acting.

In some embodiments, a cross-linking agent is added to the resist. The cross-linking agent reacts with one group from one of the hydrocarbon structures in the polymer resin and also reacts with a second group from a separate one of the hydrocarbon structures in order to cross-link and bond the two hydrocarbon structures together. This bonding and cross-linking increases the molecular weight of the polymer products of the cross-linking reaction and increases the overall linking density of the resist. Such an increase in density and linking density helps to improve the resist pattern.

Alternatively, instead of or in addition to the cross-linking agent being added to the resist composition, a coupling reagent is added in some embodiments, in which the coupling reagent is added in addition to the cross-linking agent. The coupling reagent assists the cross-linking reaction by reacting with the groups on the hydrocarbon structure in the polymer resin before the cross-linking reagent, allowing for a reduction in the reaction energy of the cross-linking reaction and an increase in the rate of reaction. The bonded coupling reagent then reacts with the cross-linking agent, thereby coupling the cross-linking agent to the polymer resin.

Alternatively, in some embodiments in which the coupling reagent is added to the resist without the cross-linking agent, the coupling reagent is used to couple one group from one of the hydrocarbon structures in the polymer resin to a second group from a separate one of the hydrocarbon structures in order to cross-link and bond the two polymers together.

The individual components of the resist are placed into a solvent in order to aid in the mixing and dispensing of the resist. To aid in the mixing and dispensing of the resist, the solvent is chosen at least in part based upon the materials chosen for the polymer resins as well as the PACs. In some embodiments, the solvent is chosen such that the polymer resins (resist polymer and protective polymer) and the PACs can be evenly dissolved into the solvent and dispensed upon the layer to be patterned.

In addition to the polymer resins, the PACs, the solvents, the cross-linking agent, and the coupling reagent, some embodiments of the resist also includes a number of other additives that assist the resist to obtain high resolution. For example, some embodiments of the resist also include surfactants in order to help improve the ability of the resist to coat the surface on which it is applied.

Another additive added to some embodiments of the resist is a quencher, which inhibits diffusion of the generated acids/bases/free radicals within the resist. The quencher improves the resist pattern configuration as well as the stability of the resist over time. In an embodiment, the quencher is an amine, such as a second lower aliphatic amine, a tertiary lower aliphatic amine, or the like. In some embodiments, an organic acid is used as the quencher.

Other additives added to some embodiments of the resist include a stabilizer, which assists in preventing undesired diffusion of the acids generated during exposure of the resist; a dissolution inhibitor to help control dissolution of the resist during development; a plasticizer to reduce delamination and cracking between the resist and underlying layers; a coloring agent to assist observers in examining the resist to find any defects that may need to be remedied prior to further processing; adhesion additives to promote adhesion between the resist and an underlying layer upon which the resist has been applied (e.g., the layer to be patterned); and surface leveling agents to assist a top surface of the resist to be level, so that impinging light will not be adversely modified by an unlevel surface.

In some embodiments, the polymer resin and the PACs, along with any desired additives or other agents, are added to the solvent for application. Once added, the mixture is then mixed in order to achieve a homogenous composition throughout the resist to ensure that there are no defects caused by uneven mixing or nonhomogenous composition of the resist. Once mixed together, the resist may either be stored prior to its usage or used immediately.

After the resist layer 230 has been applied to the layer to be patterned, a pre-bake of the resist layer 230 is performed in some embodiments to cure and dry the resist layer 230 to radiation exposure. The curing and drying of the resist layer 230 removes the solvent component while leaving behind the polymer resins, the PACs, the cross-linking agent, and the other chosen additives. In some embodiments, the pre-baking is performed at a temperature suitable to evaporate the solvent, and the temperature depends upon the materials chosen for the resist. The pre-baking is performed for a time sufficient to cure and dry the resist layer and protective layer.

Figure 2C:
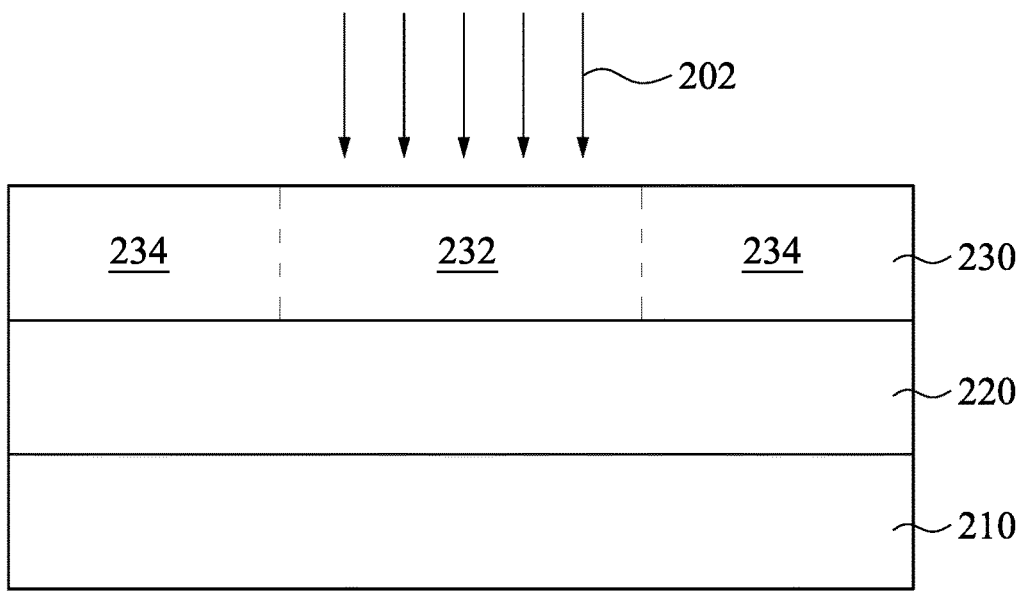

In FIG. 2C, an exposure process is performed on the resist layer 230 (e.g., block 120 of the method 100), where the resist layer 230 is illuminated with patterned radiation 202. In some implementations, the patterned radiation 202 has a wavelength less than about 250 nm, such as DUV radiation (e.g., 248 nm radiation from a KrF laser or 193 nm radiation from an ArF laser), EUV radiation, x-ray radiation, e-beam radiation, ion-beam radiation, and/or other suitable radiation. In the depicted embodiment, the patterned radiation 202 is EUV radiation, which may refer to radiation having a wavelength of about 1 nm to about 100 nm. In some implementations, the EUV radiation has a wavelength of about 10 nm to about 15 nm (e.g., about 13.5 nm). The exposure process can be in air, liquid (immersion lithography), or vacuum (e.g., when implementing EUV lithography and/or e-beam lithography). In some implementations, the radiation is patterned using a mask having an IC pattern defined therein, such that the patterned radiation forms an image of the IC pattern on the resist layer 230. The mask transmits, absorbs, and/or reflects the radiation depending on the IC pattern, along with mask technologies used to fabricate the mask. In some implementations, the radiation beam is patterned by directly modulating the radiation beam according to an IC pattern without using a mask (sometimes called maskless lithography).

A latent pattern is formed on the resist layer 230 by the exposure process. The latent pattern is formed on the resist layer 230, which eventually becomes a physical resist pattern when the resist layer 230 is subjected to developing and rinsing processes. The latent pattern includes exposed portions 232 and unexposed portions 234 (which may include both unexposed portions and under-exposed portions of resist layer 230). As shown in FIG. 2C, the exposed portions 232 physically and/or chemically change in response to the exposure process. For example, PAC components in the exposed portions 232 of the resist layer 230 generate acid upon absorbing radiation, which functions as a catalyst for causing chemical reactions that increase solubility of the exposed portions 232.

One possible reaction mechanism may occur during the exposure (and post-exposure baking). In particular, an initial polymer includes a side chain with a carboxylic acid protected by one of the groups to be removed (e.g., acid labile groups). The groups to be removed are removed in a de-protecting reaction, which is initiated by a proton $H^+$ generated by, e.g., the photoacid generator during the exposure process. That is, the acid is produced during the exposure process. This proton $H^+$ removes the groups to be removed and another hydrogen atom may replace the removed structure to form a de-protected polymer.

After the exposure process, a post-exposure baking (PEB) process (e.g., the block 130 of the method 100) may be performed on the resist layer 230. PEB can promote the cross-linking of polymer and/or suppression of reactions of other resist components with the polymer. Depending on the polymer(s) included in the resist layer 230, PEB may catalyze a reaction between reacted photosensitive moieties and the polymer in the resist layer 230. Any suitable baking conditions (e.g., duration or temperature profiles, baking cycles) may be used. In the depicted embodiment, the exposure process and/or the PEB process increase the polarity of the exposed portions 232, increasing solubility of the exposed portions 232 to a developer with relatively high polarity (e.g., the aqueous-based solution). In contrast, the polarity of the unexposed portions 234 remains low (or increases less than the exposed portions 232) after the PEB process, so the unexposed portions 234 are less soluble in a developer with relatively high polarity (e.g., the aqueous-based solution).

Figure 2D:
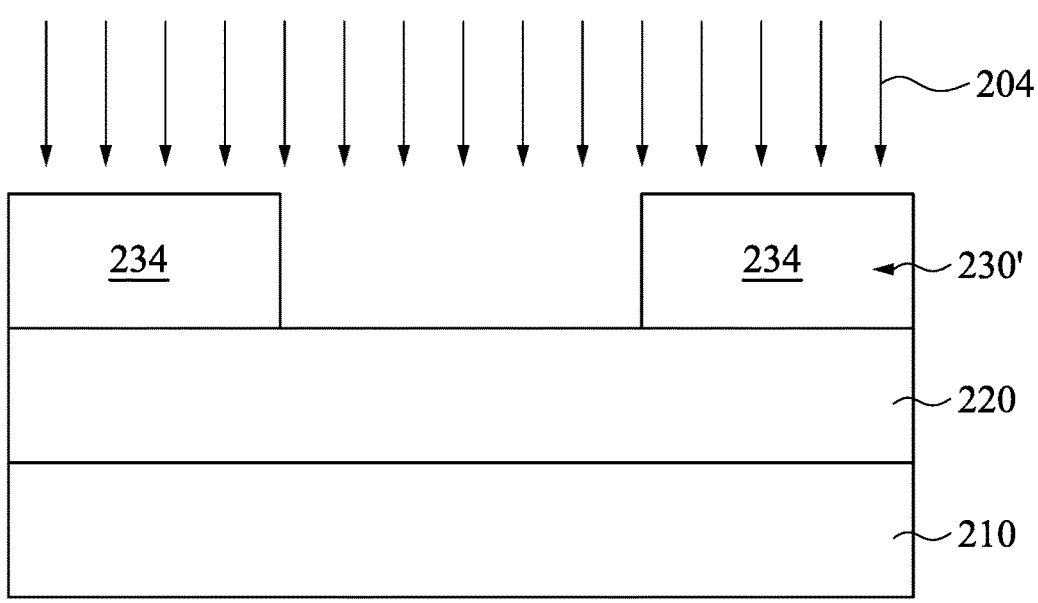

In FIG. 2D, a developing process is performed on the resist layer 230 (e.g., the block 140 of the method 100), thereby forming a patterned resist layer 230'. In the depicted embodiment, a PTD process is performed to remove the exposed portions 232 of the resist layer 230. For example, a PTD developer 204 is applied to the resist layer 230 that dissolves the exposed portions 232, leaving the patterned resist layer 230' having opening(s) defined therein between the unexposed portions 234 (collectively called a resist pattern). During the developing process, the carboxyl groups (e.g., —COOH) are deprotonized and become negative charged polymer (e.g., —COO") which has good solubility to the PTD. In some implementations, the PTD developer 204 contains no organic. Applying the PTD developer 204 may include spraying the PTD developer 204 on the patterned resist layer 230' by a spin-coating process.

The PTD, such as hydrophilic tetramethylammonium hydroxide (TMAH), applied to the resist layer 230, the exposed portion 232 (hydrophilic) of the resist layer 230 are dissolved by the hydrophilic developer TMAH during the developing process and the unexposed portions 234 (hydrophobic) of the resist layer 230 remain to form the patterned resist layer 230'. In some other embodiments, the PTD developer 204 may be TMAH, tetra butyl ammonium hydroxide, sodium hydroxide, potassium hydroxide, sodium carbonate, sodium bicarbonate, sodium silicate, sodium metasilicate, aqueous ammonia, monomethylamine, dimethylamine, trimethylamine, monoethylamine, diethylamine, triethylamine, monoisopropylamine, diisopropylamine, triisopropylamine, monobutylamine, dibutylamine, monoethanolamine, diethanolamine, triethanolamine, dimethylaminoethanol, diethylaminoethanol, potassium metasilicate, sodium carbonate, tetraethylammonium hydroxide, combinations of these, or the like.

Figure 2E:
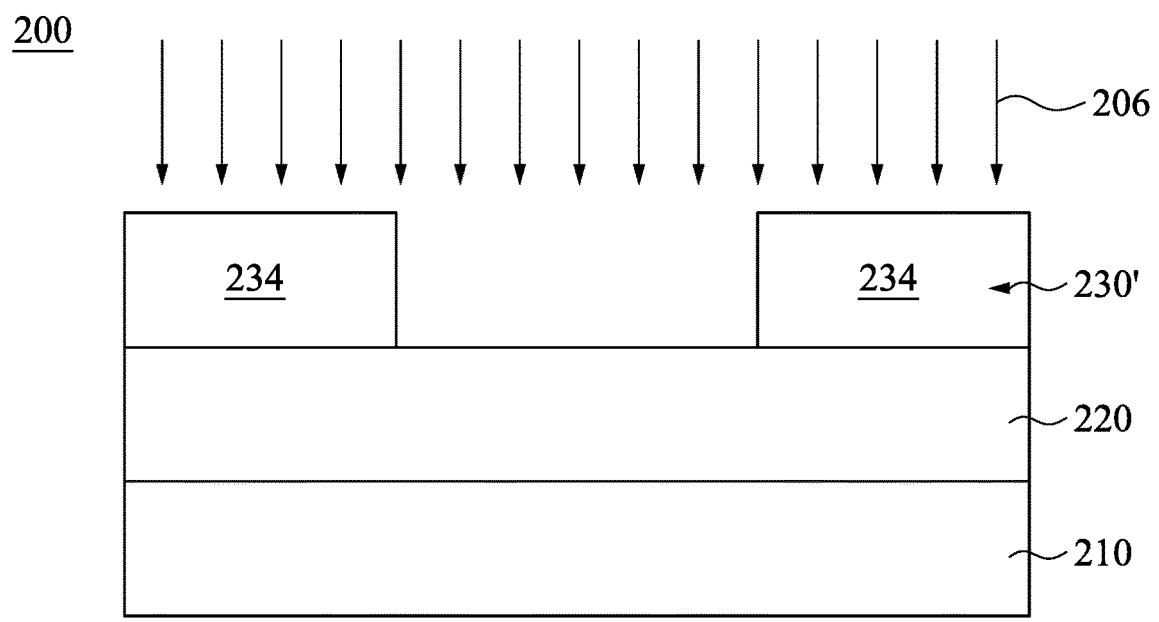

In FIG. 2E, a rinse process is performed after the developing process, for example, to remove any residue and/or particles from the workpiece 200 (e.g., the block 110 of the method 100). In the depicted embodiment, a rinse solution 206 is applied to the patterned resist layer 230' to remove unwanted materials. The rinse solutions may use deionized (DI) water. Although the DI water may be adequate for its intended purposes, it often lead to various issues, especially when technology nodes become smaller (e.g., 20 nm and beyond). For instance, during the rinse process, the DI water is prone to provide hydrogen ions to the negative charged polymer (e.g., —COO"), thereby protonizing the negative charged polymer. These protonized polymers (e.g., —COOH) are less soluble to the DI water, resulting residues in the patterned resist layer 230'. The issues become more serious with smaller patterns because the residues are more likely to induce pattern critical dimension (CD) issues.

The present disclosure solves issues in existing approaches by changing the composition of rinse solutions. Base is added to the rinse solution 206 to decrease the overall hydrogen ions of the rinse solution 206, which in turn reduces residues of patterned resist layer 230'. Furthermore, since the base includes negative ions (charges), which have electrostatic repulsion to the negative charged polymer, the negative charged polymer can be removed efficiently. In some embodiments, the pH value of the rinse solution 206 is higher than 7.5. That is, the rinse solution 206 is a basic aqueous rinse solution.

The composition of the rinse solution 206 is configured herein to achieve the desired result. For instance, the rinse solution 206 includes water (may be DI water) and base, which has a pH value higher than about 7.5. If the pH value of the base (or the rinse solution 206) is lower than 7.5, the rinse solution 206 may not provide sufficient $OH^-$ to prevent the negative charged polymer from being protonized. In some embodiments, the pH value of the base (or the rinse solution 206) is designed to be within a specific range because, even though the base helps reduce or avoid producing residues of the patterned resist layer 230', too high pH value in the rinse solution 206 may negatively impact the ability of the rinse solution 206 to rinse the patterned resist layer 230'. The reason is that, if the pH value of the base (or the rinse solution 206) is too high, the rinse solution 206 may provide too much $OH^-$ ions, such that the patterned resist layer 230' is further deprotonized. As a result, the accuracy of critical dimension of the patterned resist layer 230' suffers. Therefore, the pH value of the base (or the rinse solution 206) is in a range of about 7.5 to about 12 (or between about 8 and about 12 in another example). In some embodiments, the pH value of the base (or the rinsing solution 206) is lower than the pH value of the developer 204. Note that, in some embodiments, the pH value of the base (or the rinse solution 206) is at least about 7.5 to ensure sufficient increase in the overall $OH^-$ of the rinse solution 206.

In some embodiments, the rinsing process is performed at a temperature in a range of about 20° C. to about 40° C. The temperature affects the reaction speed of the rinse solution 206. That is, the reaction between the base and the resist layer 230 is faster when the temperature increases. Thus, the lower limit (e.g., about 20° C.) ensures the removal of the water-soluble molecules in the resist layer 230, while the upper limit (e.g., about 40° C.) prevents the rinse solution 206 from overreacting with the resist layer 230'. The overreacting between the rinse solution 206 and the resist layer 230' causes some portions of the resist layer 230' dissolve in the rinse solution 206, affecting the accuracy of critical dimension of the patterned resist layer 230'. Maintaining the rinsing temperature helps reduce or avoid the residue problems described above.

In some embodiments, the rinsing time is shorter than about 3 minute. Since most water-soluble molecules of the resist layer 230 can be removed less than 3 minute in some embodiments, the rinse time which is longer than about 3 minute may produce similar resulting patterns of the patterned resist layer 230' as the rinse time which is shorter than about 3 minute. It may waste the fabrication time, and the throughput of the manufacturing process is reduced. In some embodiments, the rinsing time is in a range of about 15 seconds to about 120 seconds, where the lower limit (e.g., about 15 seconds) ensures the removal of the water-soluble molecules in the resist layer 230, while the upper limit (e.g., about 120 seconds) prevents wasting the fabrication time.

In some embodiments, the base includes ammonia, methylamine, dimethylamine, trimethylamine, pyridine, imidazole, pyrrole, 4-methylimidazole, pyrazole, pyrazoline, pyrazolidine, methylethylamine, oxazole, thiazole, combinations thereof, or the like. In some embodiments, the rinse solution 206 is free of TMAH because TMAH has high pH value, which may induce the critical dimension problem. In some embodiments, the base concentration of the rinsing solution 206 is greater than about 0.2 parts per million (ppm). The resulting patterns of the patterned resist layer 230' are similar when the base concentration of the rinsing solution 206 is about 300 ppm or more. As such, in some embodiments, the base concentration of the rinsing solution 206 is in a range of about 0.2 ppm to about 300 ppm, where the lower limit (e.g., about 0.2 ppm) ensures the removal of the water-soluble molecules in the resist layer 230, while the upper limit (e.g., about 300 ppm) prevents wasting the fabrication time. Furthermore, the base may contain defect source which causes defects in the patterned resist layer 230'. As such, the rinsing solution 206 may produce defects in the patterned resist layer 230' if the base concentration of the rinsing solution 206 is higher than 300 ppm.

Figure 2F:
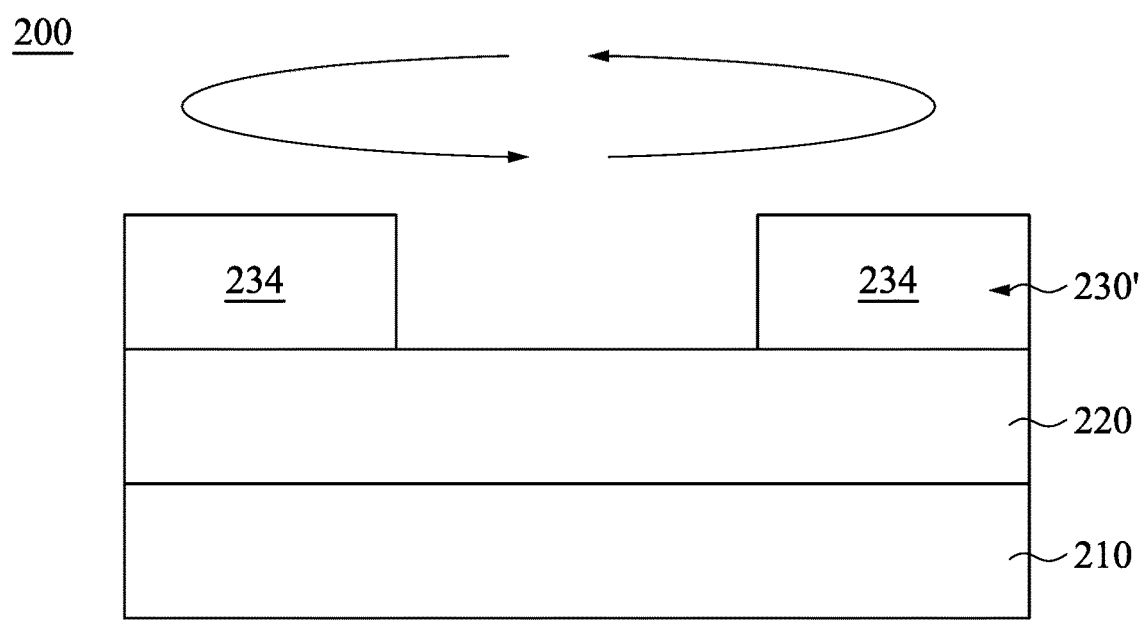

In FIG. 2F, a spin dry process is performed on the patterned resist layer 230' (e.g., the block 170 of the method 100) to further remove any liquids and/or solids remaining on the patterned resist layer 230' after the rinsing process. The rinsing solution 206 of FIG. 2E may be substantially removed by the spin dry process. During the spin dry process, the rinsing solution 206 is spun away from the wafer center towards the wafer edge and then removed.

Figure 2G:
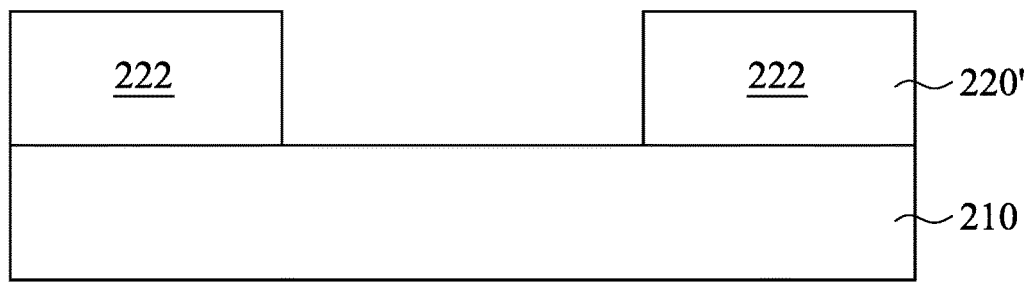
Figure 2H:
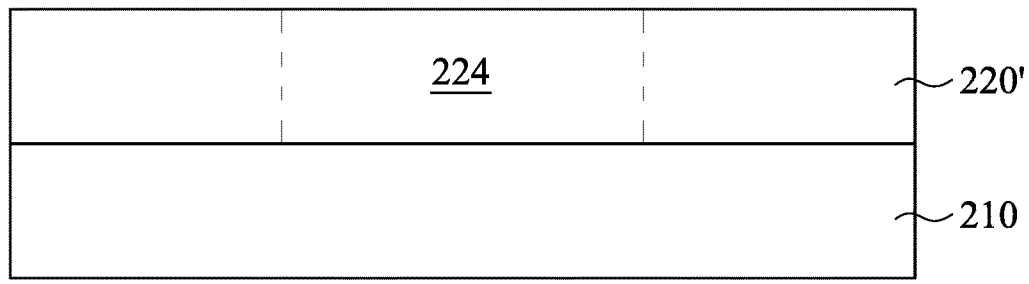
Figure 2I:
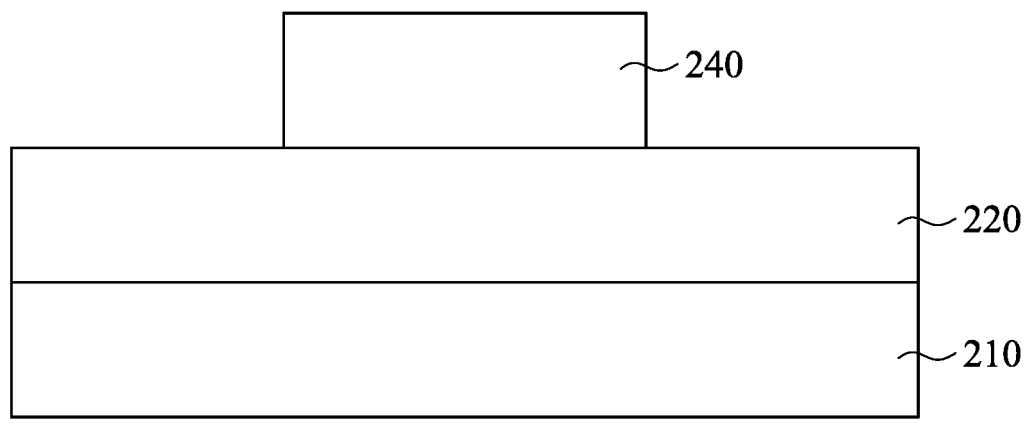

Referring now to FIGS. 2G, 2H, and 2I, an additional fabrication process is performed on the workpiece 200 using the patterned resist layer 230' as a mask (e.g., corresponding to the block 170 of the method 100). For example, the fabrication process is applied within opening(s) of the patterned resist layer 230', while other portions of the workpiece 200 covered by the patterned resist layer 230' are protected from being impacted by the fabrication process. In some implementations, the fabrication process etches the material layer 220 using the patterned resist layer 230' as an etching mask as shown in FIG. 2G. A pattern is thus transferred from the patterned resist layer 230' to the material layer 220, thereby forming patterned material layer 220' with patterns 222. The etching process may include a dry etching process, a wet etching process, other suitable etching process, or combinations thereof. Alternatively, the fabrication process may include an implantation process on the material layer 220 using the patterned resist layer 230' as an implant mask, thereby forming various doped features (regions) 224 in the material layer 220' as shown in FIG. 2H. In some other embodiments, instead of the patterning the material layer 220, a deposition process is performed to fill opening(s) of the patterned resist layer 230' with a material, thereby forming IC features (e.g., conductive material lines 240) over the material layer 220 as shown in FIG. 2I. Thereafter, as depicted in FIGS. 2G, 2H, and 2I, the patterned resist layer 230' is removed from the workpiece 200.

Figure 3:
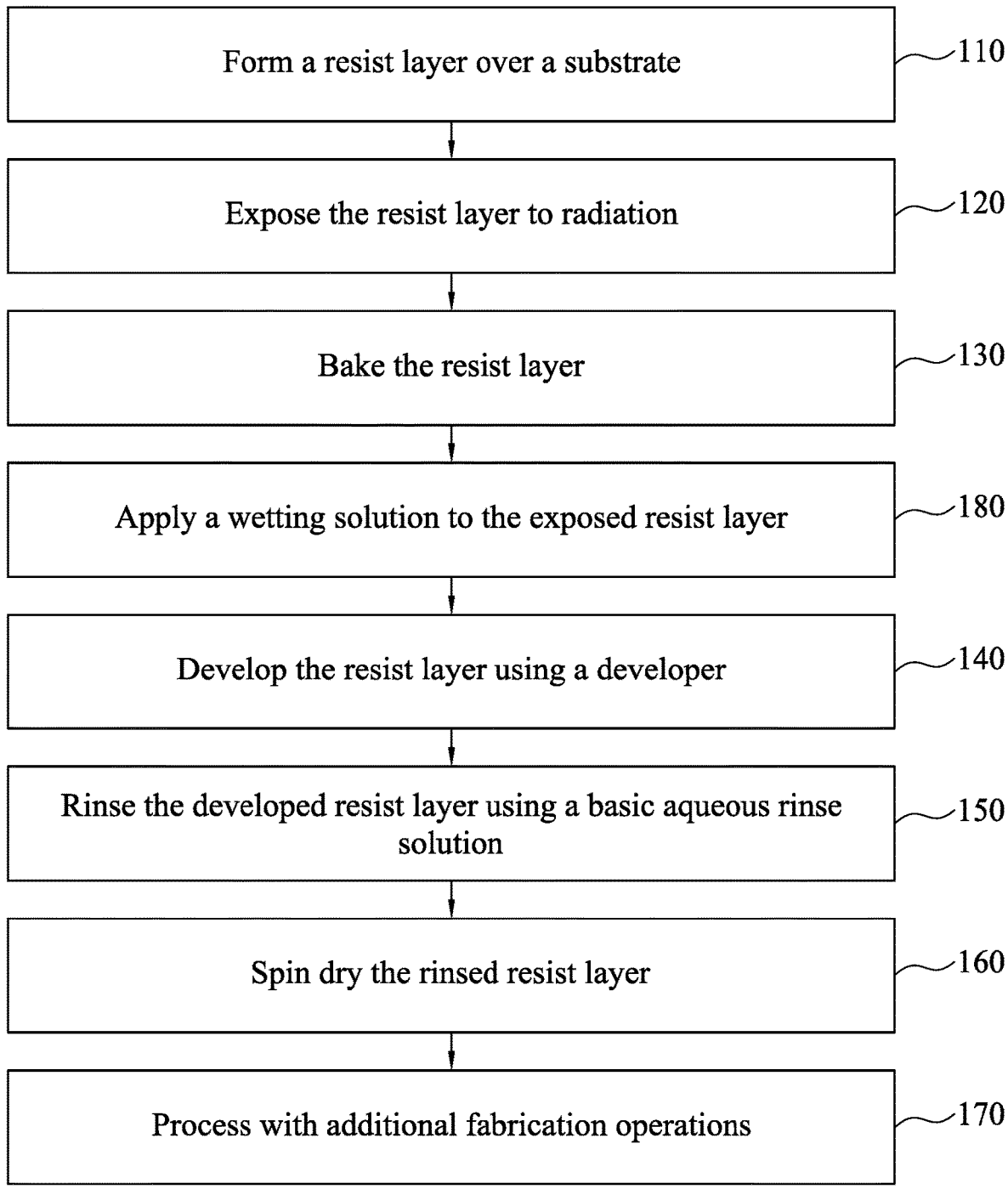
FIG. 3 is a flow chart of a lithography method for processing a workpiece according to various aspects of the present disclosure.

FIG. 3 is a flow chart of a lithography method 300 for processing a workpiece (e.g., a substrate) according to various aspects of the present disclosure. The method 300 is similar to the method 100 of FIG. 1 except that the method 300 further includes an operation 180 between the operations 130 and 140. In some embodiments, a wetting solution which has the similar (or same) composition to the rinsing solution 206 is applied to the exposed resist layer 230 to wet the exposed resist layer 230 and thus ensures wettability of the exposed resist layer 230. That is, the wetting solution is a basic aqueous solution. In some embodiments, the wetting solution is free of TMAH. Since the details of the basic aqueous solution are similar to or the same as the basic aqueous rinse solution 206 mentioned in FIG. 2E, a description in this regard will not be repeated hereinafter. This operation benefits the developing process. The wetting solution helps the developer 204 provides good "coverage" over the entire surface of the exposed resist layer 230. Also, since the wetting solution includes base, the wetting solution prevents the polymers in the resist layer 230 from being protonized. Other relevant operation details of the method 300 are similar to or the same as the method 100, and, therefore, a description in this regard will not be repeated hereinafter.

Figure 4:
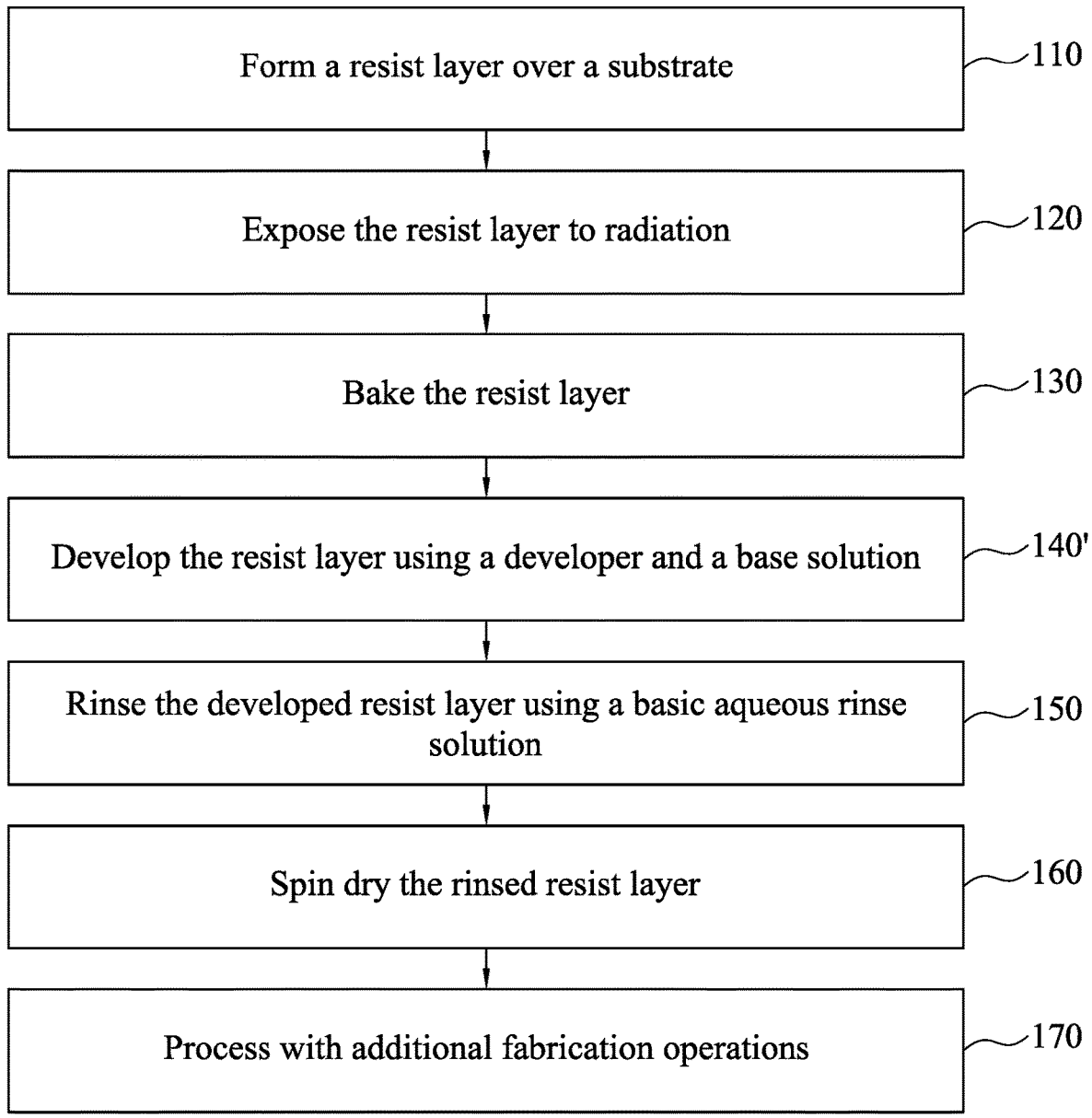
FIG. 4 is a flow chart of a lithography method for processing a workpiece according to various aspects of the present disclosure.

FIG. 4 is a flow chart of a lithography method 400 for processing a workpiece (e.g., a substrate) according to various aspects of the present disclosure. The method 400 is similar to the method 100 of FIG. 1 except that the method 400 includes an operation 140' instead of the operation 140. In some embodiments, a base aqueous solution which has the similar (or same) composition to the rinsing solution 206 is further applied to the exposed resist layer 230 with the developer 204 during the developing process. That is, the base aqueous solution is a basic aqueous rinse solution. In some embodiments, the base aqueous solution is free of TMAH. Since the details of the basic aqueous solution are similar to or the same as the basic aqueous rinse solution mentioned 206 in FIG. 2E, a description in this regard will not be repeated hereinafter. The base aqueous solution and the developer 204 may be individually applied to the exposed resist layer 230 in some embodiments, and may be mixed in advanced and then applied to the exposed resist layer 230 in some other embodiments. In some embodiments, a base concentration of the base aqueous solution is lower than a base concentration of the developer 204, such that the developing process can be sufficiently performed (the developer 204 dominates the developing parameters such as developing time, developing temperature, . . . ), while the base aqueous solution can prevent the polymers in the resist layer 230 from being protonized. Other relevant operation details of the method 400 are similar to or the same as the method 100, and, therefore, a description in this regard will not be repeated hereinafter.

Figure 5A:
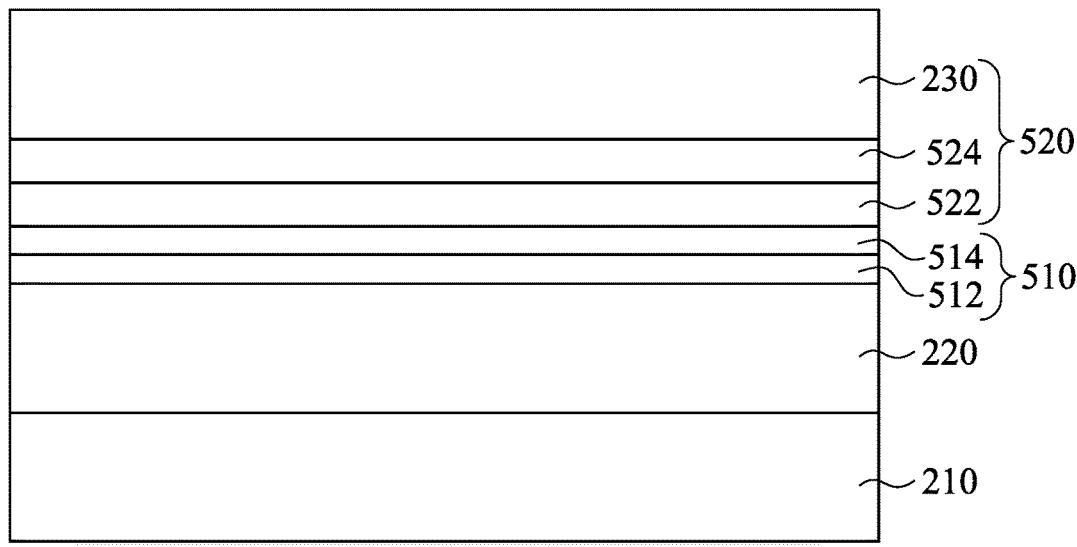
FIGS. 5A to 5E are cross-sectional views of a workpiece, in portion or entirety, at various fabrication stages according to various aspects of the present disclosure.

FIGS. 5A to 5E are cross-sectional views of a workpiece 500, in portion or entirety, at various fabrication stages according to various aspects of the present disclosure. The workpiece 500 is similar to the workpiece 200 in FIG. 2A-2I, except the workpiece 500 includes some layers between the resist layer 230 and the material layer 220. In FIG. 5A, the workpiece 500 further includes a hard mask 510 formed over the material layer 220. The hard mask 510 may be deposited by a CVD process, a PVD process, an ALD process, a spin-on process, other suitable deposition processes, or a combination thereof. In some embodiments, the hard mask 510 includes a multi-layer hard mask. The multi-layer hard mask 510 includes an intermetal layer 512 and a silicon-containing layer 514 over the intermetal layer 512. The intermetal layer 512 may include a titanium nitride layer, a titanium oxide layer, a tantalum nitride layer, other suitable metal layers, or combinations thereof. In some embodiments, the intermetal layer 510 is a titanium nitride layer. The silicon-containing layer 514 may include a silicon oxide ($SiO_x$) layer, a silicon oxycarbide ($SiO_xC_y$) layer, a silicon carbon nitride ($SiC_xN_y$) layer, a silicon carbon ($SiC_x$) layer, a silicon nitride ($SiN_x$) layer, a polymer photoresist layer, or combinations thereof. In some embodiments, the silicon-containing layer 514 is a $SiO_x$ layer. In some embodiments, the silicon-containing layer 514 is deposited by a CVD process using TEOS as a process gas.

A multi-layer structure 520 is formed over the hard mask 510. In some embodiments, the multi-layer structure 520 includes a bottom layer 522, a middle layer 524 over the bottom layer 522, and the resist layer 230 over the middle layer 524. The bottom layer 522 of the multi-layer structure 520 is formed over the hard mask 510. The bottom layer 522 includes a $C_xH_yO_z$ material, silicon oxide ($SiO_x$), silicon oxycarbide ($SiO_xC_y$), a polymer material, or other suitable materials. The bottom layer 522 may be deposited by a CVD process, an evaporation process, a spin-on process, other suitable deposition processes, or combinations thereof. In some embodiments, the middle layer 524 includes a $SiC_xH_yO_z$ material. The middle layer 524 may be deposited by a CVD process, an evaporation process, a spin-on process, other suitable deposition processes, or combinations thereof.

Figure 5B:
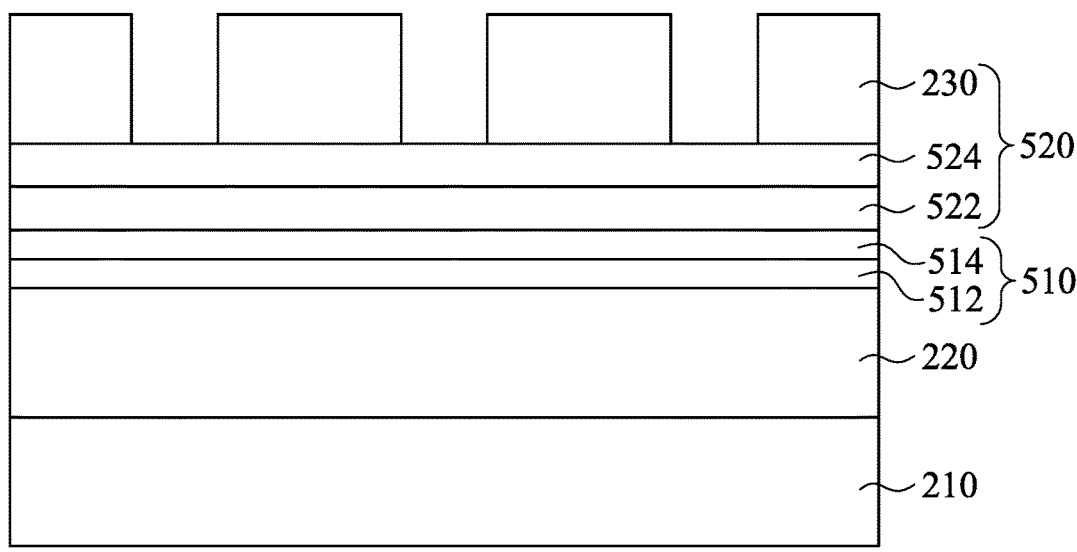

Reference is made to FIG. 5B. The resist layer 230 is patterned to form the patterned resist layer 230' by performing the method 100, 300, or 400 as mentioned above, and thus a description thereof is omitted.

Figure 5C:
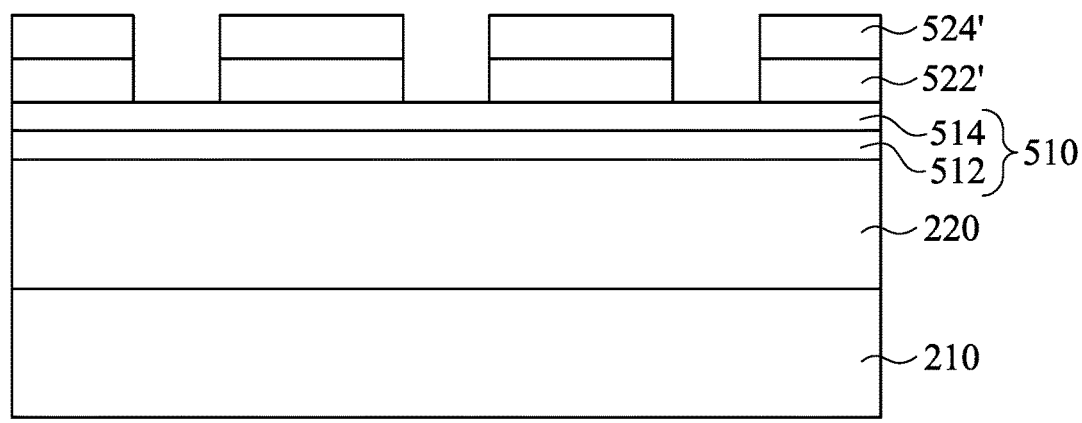

Reference is made to FIG. 5C. A first etch process is performed to pattern the middle layer 524, and a second etch process is performed to pattern the bottom layer 522. The middle layer 524 is patterned using the patterned resist layer 230' as a mask, and the bottom layer 522 is patterned using the patterned middle layer 524' as a mask. During the first and/or second etch process(es), the patterned resist layer 230' may be partially or entirely consumed.

Figure 5D:
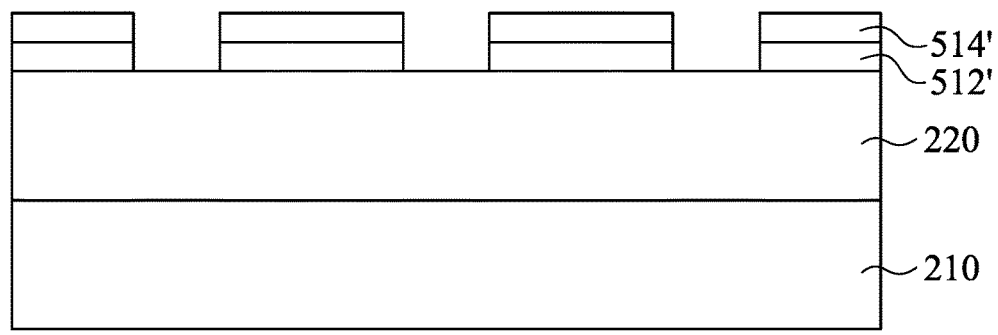

Reference is made to FIG. 5D. A third etch process is performed to pattern the silicon-containing layer 514, and a fourth etch process is performed to pattern the intermetal layer 512. The silicon-containing layer 514 is patterned using the patterned bottom layer 522' as a mask, and the intermetal layer 512 is patterned using the patterned silicon-containing layer 514' as a mask. During the third and/or fourth etch process(es), the patterned bottom layer 522' may be partially or entirely consumed.

Figure 5E:
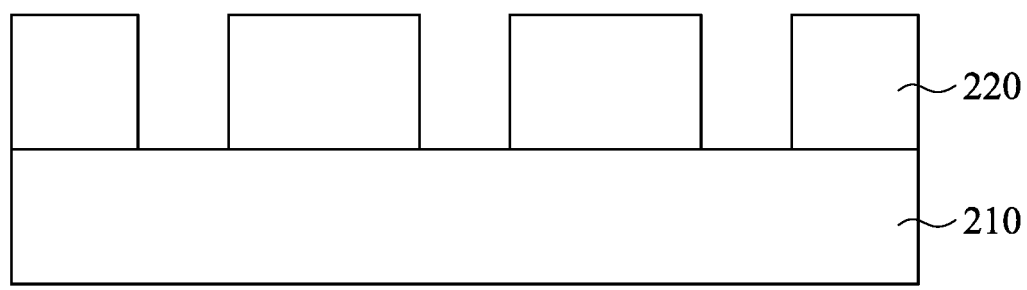

Reference is made to FIG. 5E. A fifth etch process is performed to pattern the material layer 220. The material layer 220 is patterned using the intermetal layer 512' as a mask. Since the relevant operation details of the fifth etch process is similar to or the same as the process shown in FIG. 2G, and, therefore, a description in this regard will not be repeated hereinafter.

According to some embodiments, a lithography method includes forming a resist layer over a substrate. The resist layer is exposed to radiation. The exposed resist layer is developed using a developer, thereby forming a patterned resist layer. The patterned resist layer is rinsed using a basic aqueous rinse solution.

According to some embodiments, a lithography method includes forming a resist layer over a substrate. The resist layer is exposed to radiation. The resist layer is developed in a positive tone developer, thereby forming a patterned resist layer. A basic aqueous solution is provided to the resist layer during developing the resist layer. A pH value of the basic aqueous solution is lower than a pH value of the positive tone developer, and a base concentration of the basic aqueous solution is lower than a base concentration of the positive tone developer.

According to some embodiments, a lithography method includes forming a resist layer over a substrate. The resist layer is exposed to radiation. The exposed resist layer is wetted using a basic aqueous solution. The exposed resist layer is developed using a developer that removes an exposed portion of the exposed resist layer, thereby forming a patterned resist layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lithography method comprising:
   forming a resist layer over a substrate;
   exposing the resist layer to radiation;
   developing the exposed resist layer using a developer, thereby forming a patterned resist layer;
   providing a basic aqueous solution to the exposed resist layer during developing the exposed resist layer, wherein the developer is a first aqueous solution of a first base, the basic aqueous solution is a second aqueous solution of a second base, and the first base is different from the second base; and
   rinsing the patterned resist layer using a basic aqueous rinse solution.

2. The lithography method of claim 1, wherein a pH value of the basic aqueous rinse solution is lower than a pH value of the developer.

3. The lithography method of claim 2, wherein the pH value of the basic aqueous rinse solution is in a range of about 8 to about 12.

4. The lithography method of claim 1, wherein the basic aqueous rinse solution comprises a third base comprising ammonia, methylamine, dimethylamine, trimethylamine, pyridine, imidazole pyrrole, 4-methylimidazole, pyrazole, pyrazoline, pyrazolidine, methylethylamine, oxazole, thiazole, or combinations thereof.

5. The lithography method of claim 1, wherein the second base comprises ammonia, methylamine, dimethylamine, trimethylamine, pyridine, imidazole pyrrole, 4-methylimidazole, pyrazole, pyrazoline, pyrazolidine, methylethylamine, oxazole, thiazole, or combinations thereof.

6. The lithography method of claim 1, wherein a pH value of the basic aqueous solution is lower than a pH value of the developer.

7. The lithography method of claim 1, further comprising wetting the exposed resist layer using a basic aqueous wetting solution before developing the exposed resist layer.

8. The lithography method of claim 7, wherein the basic aqueous wetting solution and the basic aqueous rinse solution comprises the same base.

9. The lithography method of claim 1, wherein a rinse time of rinsing the patterned resist layer is less than about 3 minutes.

10. The lithography method of claim 1, wherein a rinse temperature of rinsing the patterned resist layer is in a range of about 20° C. to about 40° C.

11. A lithography method comprising:
    forming a resist layer over a substrate;
    exposing the resist layer to radiation;
    wetting the exposed resist layer using a basic aqueous solution; and
    after wetting the exposed resist layer using the basic aqueous solution, developing the exposed resist layer using a developer that removes an exposed portion of the exposed resist layer, thereby forming a patterned resist layer.

12. The lithography method of claim 11, wherein a pH value of the basic aqueous solution is lower than a pH value of the developer.

13. The lithography method of claim 11, wherein the basic aqueous solution comprises a base comprising ammonia, methylamine, dimethylamine, trimethylamine, pyridine, imidazole, pyrrole, 4-methylimidazole, pyrazole, pyrazoline, pyrazolidine, methylethylamine, oxazole, thiazole, or combinations thereof.

14. The lithography method of claim 11, wherein the basic aqueous solution is free of tetramethylammonium hydroxide (TMAH).

15. A lithography method comprising:
    forming a resist layer over a substrate;
    exposing the resist layer to radiation;
    developing the resist layer in a positive tone developer, thereby forming a patterned resist layer; and
    providing a basic aqueous solution to the resist layer during developing the resist layer, wherein a pH value of the basic aqueous solution is lower than a pH value of the positive tone developer, and a base concentration of the basic aqueous solution is lower than a base concentration of the positive tone developer.

16. The lithography method of claim 15, wherein the basic aqueous solution is free of tetramethylammonium hydroxide (TMAH).

17. The lithography method of claim 15, wherein the basic aqueous solution comprises a base comprising ammonia, methylamine, dimethylamine, trimethylamine, pyridine, imidazole, pyrrole, 4-methylimidazole, pyrazole, pyrazoline, pyrazolidine, methylethylamine, oxazole, thiazole, or combinations thereof.

18. The lithography method of claim 15, wherein the base concentration of the basic aqueous solution is in a range of about 0.2 ppm to about 300 ppm.

19. The lithography method of claim 11, wherein the developer is a first aqueous solution of a first base, the basic aqueous solution is a second aqueous solution of a second base, and the first base is different from the second base.

20. The lithography method of claim 15, wherein the positive tone developer is a first aqueous solution of a first base, the basic aqueous solution is a second aqueous solution of a second base, and the first base is different from the second base.

* * * * *